United States Patent
Chiono

(10) Patent No.: US 12,117,468 B2
(45) Date of Patent: *Oct. 15, 2024

(54) MEASURING CIRCUIT OF THE VOLTAGE OF AN ELECTRIC MACHINE, SYSTEM AND PROCESS FOR CALIBRATING ELECTRIC MACHINES USING SUCH CIRCUIT

(71) Applicant: MAVEL EDT S.P.A., Pont Saint Martin (IT)

(72) Inventor: Denny Chiono, Pont Saint Martin (IT)

(73) Assignee: MAVEL EDT S.P.A., Pont Saint Martin (IT)

( * ) Notice: Subject to any disclaimer, the term of this patent is extended or adjusted under 35 U.S.C. 154(b) by 119 days.

This patent is subject to a terminal disclaimer.

(21) Appl. No.: 17/904,569

(22) PCT Filed: Feb. 25, 2020

(86) PCT No.: PCT/IT2020/000024
§ 371 (c)(1),
(2) Date: Aug. 18, 2022

(87) PCT Pub. No.: WO2021/171323
PCT Pub. Date: Sep. 2, 2021

(65) Prior Publication Data
US 2023/0097341 A1 Mar. 30, 2023

(51) Int. Cl.
*G01R 19/00* (2006.01)
*G01D 5/14* (2006.01)
*G01D 18/00* (2006.01)

(52) U.S. Cl.
CPC ........... *G01R 19/0023* (2013.01); *G01D 5/14* (2013.01); *G01D 18/00* (2013.01)

(58) Field of Classification Search
CPC ....... G01R 19/0023; G01D 5/14; G01D 18/00
See application file for complete search history.

(56) References Cited

U.S. PATENT DOCUMENTS 4,900,993 A * 2/1990 Yasohara ................ H02P 6/182
318/400.06
5,159,246 A * 10/1992 Ueki ........................ H02P 6/18
318/400.06
(Continued)

FOREIGN PATENT DOCUMENTS

CN 211043595 U * 7/2020
DE 102008059052 A1 * 5/2010 .............. H02P 23/14
(Continued)

OTHER PUBLICATIONS

International Search Report, International Application No. PCT/IT2020/000024, Oct. 27, 2020 (3 pages).

*Primary Examiner* — Walter L Lindsay, Jr.
*Assistant Examiner* — Milton Gonzalez
(74) *Attorney, Agent, or Firm* — Thomas | Horstemeyer, LLP

(57) ABSTRACT

The present disclosure provides for a measuring circuit of the voltage of an electric machine which can be used in a system and process for calibrating electric machines using such circuit. In particular, the invention refers to a measuring circuit of the voltage of an electric motor and provides for measuring the phase voltages of a synchronous, reluctance electric motor of the type with permanent magnets, in addition to any other type of electric machine. The invention allows for calibrating an electric motor using such circuit to correct errors in the position of a rotor.

6 Claims, 2 Drawing Sheets

(56) References Cited

U.S. PATENT DOCUMENTS

Figure 1:
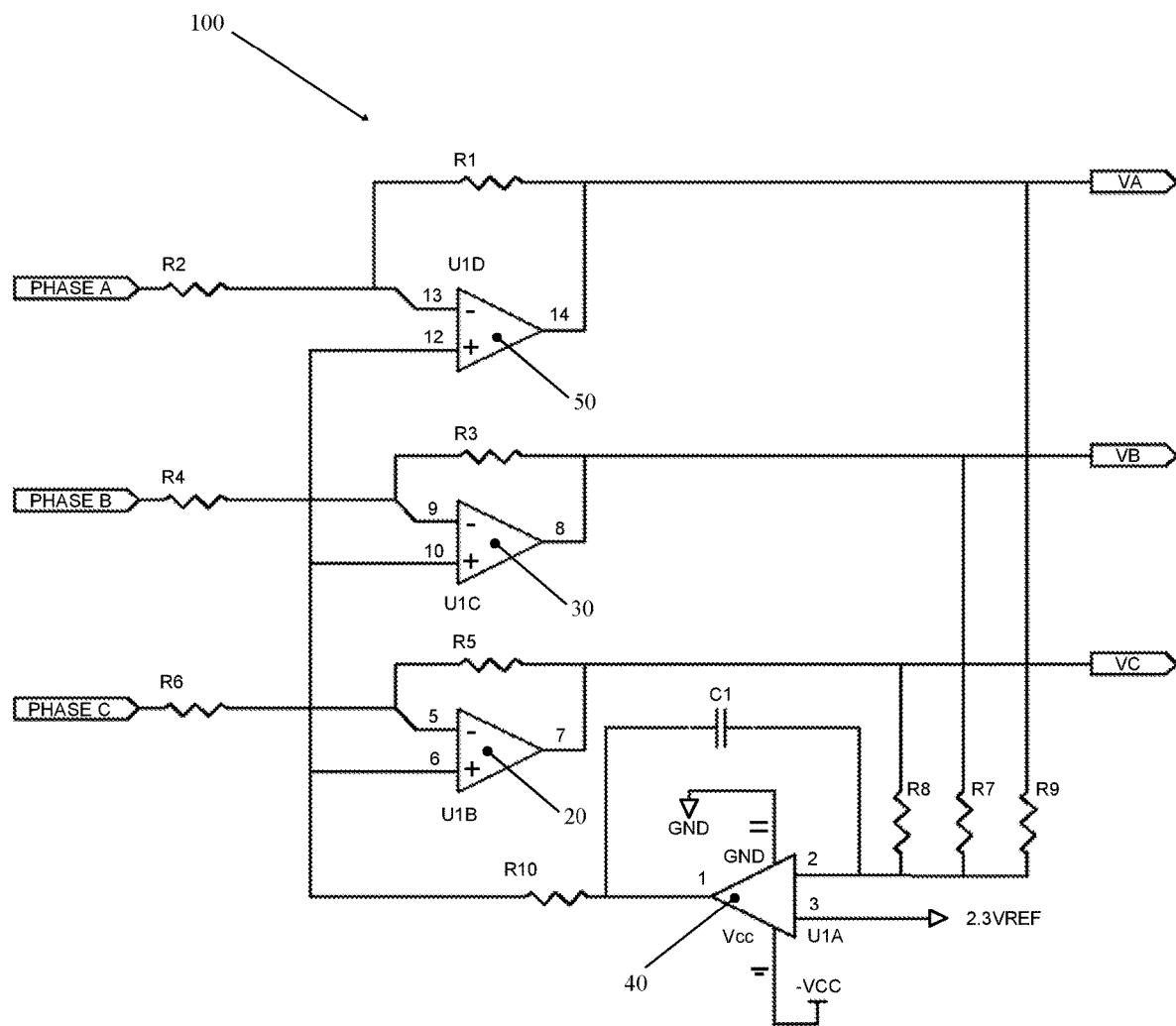

| | | | | |
|---|---|---|---|---|
| 5,694,010 A | * | 12/1997 | Oomura | ............... H02H 7/0833 |
| | | | | 318/400.07 |
| 6,396,225 B1 | * | 5/2002 | Wakui | ....................... H02P 6/20 |
| | | | | 318/400.01 |
| 7,304,452 B2 | * | 12/2007 | Nagai | ................... H02P 25/024 |
| | | | | 318/434 |
| 2005/0275361 A1 | | 12/2005 | Bolt | |

FOREIGN PATENT DOCUMENTS

| | | |
|---|---|---|
| JP | H11 122974 A | 4/1999 |
| JP | 2006 254626 A | 9/2006 |

* cited by examiner

MEASURING CIRCUIT OF THE VOLTAGE OF AN ELECTRIC MACHINE, SYSTEM AND PROCESS FOR CALIBRATING ELECTRIC MACHINES USING SUCH CIRCUIT

The present invention refers to a measuring circuit of the voltage of an electric machine, to a system and a process for calibrating electric machines using such circuit.

In particular, the invention refers to a measuring circuit of the voltage of an electric motor, more in particular for measuring the phase voltages of a synchronous, reluctance electric motor of the type with permanent magnets, but can be used with any type of electric machine; the invention further refers to a process for calibrating an electric motor using such circuit.

In order to control the operation of known electric machines, and in particular of high-performance synchronous electric motors, it is necessary to accurately know the angular position of the rotor of the electric machine: for this reason, it is very important to minimize the reading error of the position sensor installed on the rotor.

A known process for calibrating electric machines during their production, requires the measure of an error between the position of the rotor, detected for example by a position sensor, and the instantaneous angular position of the rotor, in particular the instantaneous angular position of the magnetic poles of the rotor, to correct the reading of the position sensor and use correct reading data for an optimum driving of the electric machine.

In this known process, the value of the angle of the magnetic field of the rotor is obtained through the measure of the phase voltages of the machine, which are in phase with the magnetic flux when the motor current is null (no-load operation).

Object of the present invention is providing a measuring circuit of the voltage of an electric machine which can be used in a system and a process for calibrating electric machines, to correct errors between the position of the rotor, detected for example by a position sensor, and the instantaneous angular position of the rotor, in particular the instantaneous angular position of the magnetic poles of the rotor.

The above and other objects and advantages of the invention, as will result from the following description, are obtained with a measuring circuit of the voltage of an electric machine, a system and a process for calibrating electric machines as claimed in the independent claims.

Preferred embodiments and non-trivial variations of the present invention are the subject matter of the dependent claims.

It is intended that all enclosed claims are an integral part of the present description.

It will be immediately obvious that numerous variations and modifications (for example related to shape, sizes, arrangements and parts with equivalent functionality) can be made to what is described, without departing from the scope of the invention as detailed in the enclosed claims.

Figure 2:
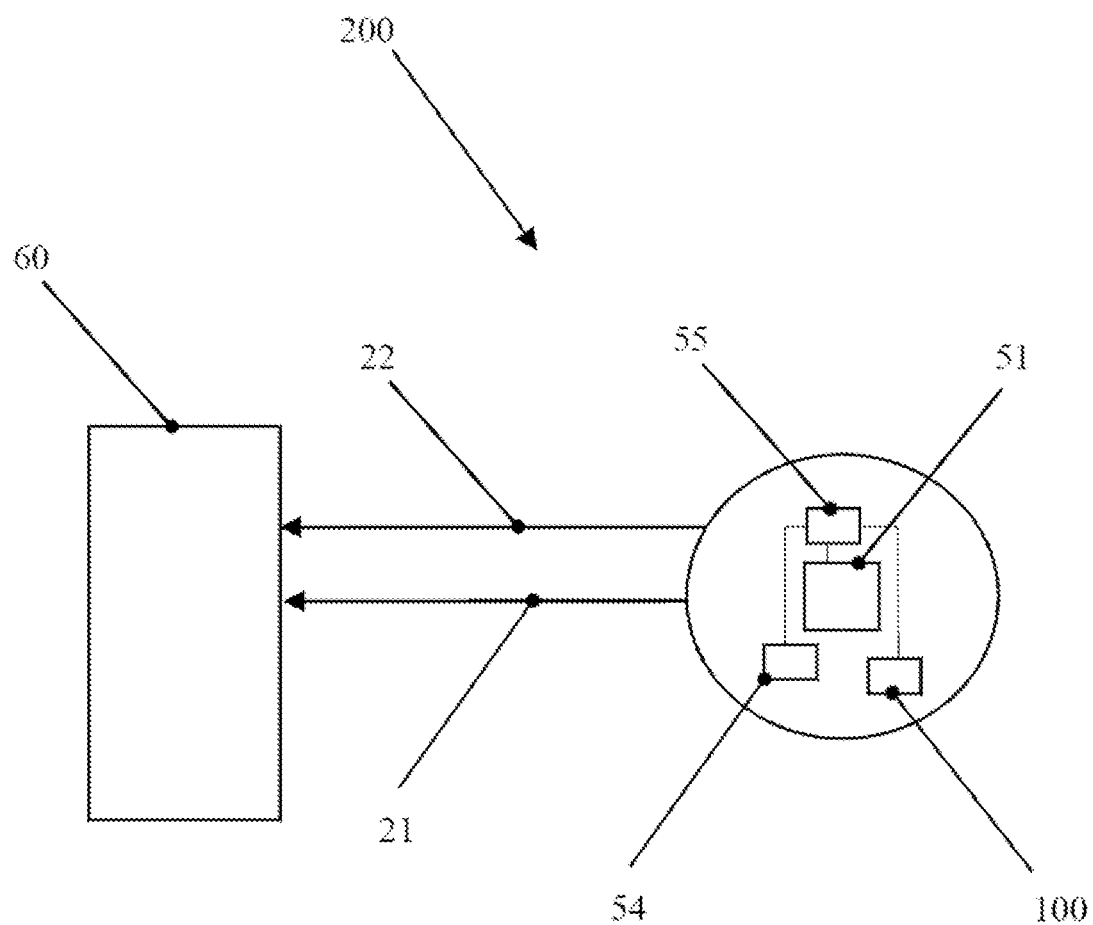

The present invention will be better described by some preferred embodiments thereof, provided as a non-limiting example, with reference to the enclosed drawings, in which:

FIG. 1 shows a schematic view of a measuring circuit of the voltage of an electric machine according to the invention; and FIG. 2 shows a schematic view of a system for calibrating electric machines according to the invention.

With reference to the Figures, the measuring circuit 100 of the voltage of an electric machine of the invention comprises a first operational amplifier 20 having its non-inverting input 6 connected to the non-inverting input 10 of at least one second operational amplifier 30, and its output 7 feedback connected, through a resistance R5, to the inverting input 5, said inverting input 5 of the first operational amplifier 20 being further connected through a resistance R6 to a first phase C of the input current to an electric machine, coming for example from an inverter 60; the output 7 of the first operational amplifier 20 is connected, a resistance through R8, to the inverting input 2 of a third operational amplifier 40 which has its non-inverting input 3 connected to a reference voltage VREF, said output 7 of the first operational amplifier 20 being further connected to a first output VC of the circuit, which is at a voltage value equal to the voltage of a first phase of the electric machine to be measured, said third operational amplifier having its output 1 feedback connected, through a capacitance C1, to the inverting input 2, said output 1 of the third operational amplifier 40 being further connected through a resistance R10 to the non-inverting input 6 of the first operational amplifier 20 and to the non-inverting input 10 of the second operational amplifier 30. The second operational amplifier 30 comprises its output 8 feedback connected, through a resistance R3, to the inverting input 9, said inverting input 9 being further connected through a resistance R4 to a second phase B of the input current to an electric machine, coming for example to the inverter 60; the output 8 of the second operational amplifier 30 is connected, through a resistance R7, to the inverting input 2 of the third operational amplifier 40 and is further connected to a second output VB of the circuit, which is at a voltage value equal to the voltage of a second phase of the electric machine to be measured.

Preferably, the measuring circuit 100 of the voltage of an electric machine of the invention further comprises a fourth operational amplifier 50 having its non-inverting input 12 connected to the non-inverting input 6, 10 of the first 20 and of the second 30 operational amplifiers, and its output 14 feedback connected, through a resistance R1, to the inverting input 13, said inverting input 13 being further connected through a resistance R2 to a third phase A of the input current of an electric machine, coming for example to the inverter 60; the output 14 of the fourth operational amplifier 50 is connected, through a resistance R9, to the inverting input 2 of the third operational amplifier 40 and is further connected to a third output VA of the circuit, which is at a voltage value equal to the voltage of a third phase of the electric machine to be measured.

The measuring circuit 100 of the voltage of an electric machine of the invention then comprises three inputs, each electrically connected to the three phases A, B, C of the input current to the electric machine, coming for example to the inverter 60, and three outputs VA, VB, VC which are each at the value of the voltage of a phase of the electric machine to be measured.

The system 200 for calibrating electric machines of the invention comprises:
- a position sensor 51 connectable to the rotor of the electric machine and configured to measure the angular position of the rotor;
- a storage unit 54 in which data are stored, which are computed during the production of the electric machine and usable for correcting errors between the position of the rotor detected by the position sensor 51 and the actual angular position of the rotor;
- a microprocessor 55 connected to the position sensor 51 and to the storage unit 54 and configured for storing in the storage unit 54 the information detected by the position sensor 51, managing and processing the information stored in the storage unit 54 and/or detected by the position sensor 51 and communicating the processed data to the inverter 60 connected to the electric machine through analogue 21 and/or digital 22 communication lines, to drive the electric machine using the actual value of the angular position of the rotor; the storage unit 54 can also be integrated in the microprocessor 55, if this latter one has a non-volatile memory available;

the measuring circuit 100 of the voltage of an electric machine according to the invention.

The process for calibrating electric machines of the invention is described below, and is implemented upon the production of an electric machine, preferably a synchronous electric motor assisted by permanent magnets, to measure the angular position of the rotor; such data are compared with the value measured by a position sensor, to detect its error; the error value is then used to correct the measure detected by the sensor through an offset software in order to perform an optimum driving of the motor coupled thereto, using the corrected value of the angular position of the rotor.

These measures are performed in a production line of the electric machine using a microprocessor of the inverter 60 connected to the electric machine; once the error value has been computed, it is stored in a storage unit which can be found on the sensor itself or on an electronic card of the inverter 60.

The process for calibrating electric machines of the invention comprises the following steps:

- a first step wherein the inverter 60 connected to the electric machine is turned on, to rotate the rotor;
- a second step wherein the electric machine is driven till the rotor reaches a rotation speed $\omega_1$ greater than a predefined rotation speed $\omega_0$, chosen for example around 10% of the rated rotation speed of the electric machine;
- a third step wherein the inverter 60 is turned off and the electric machine is left rotate with no load;
- a fourth step, performed when the rotor reaches the predefined rotation speed $\omega_0$, wherein the angular position of the rotor is detected, by measuring the position of the magnetic field of the rotor obtained from a reading of the phase voltages of the motor, to compare it with the measure of the angular position of the rotor detected by the position sensor 51, performed by measuring in a known way the position of the magnetic field of the position sensor 51;
- a fifth step wherein the difference is computed between the value of the angular position of the rotor, detected by measuring the position of its magnetic field, and the value of the angular position of the rotor detected by measuring the position of the magnetic field of the position sensor 51, to obtain the offset data to be stored;
- a sixth step wherein the offset data computed in the fifth step are stored in the storage unit 54.

Preferably, the measure of the difference between the angular position of the magnetic field of the rotor, and the angular position of the rotor detected by the position sensor 51, performed in the fifth step of the process of the invention, is performed by measuring the value of the angle of the magnetic field of the rotor through the measure of the phase voltages of the machine, which are in phase with the magnetic flux, using the voltage measuring circuit 100 of the invention.

From the value of the phase voltages, the position of the rotor θ is accurately obtained, starting from the relationship between voltage V, rotation speed ω of the rotor and flux of the magnetic field λ.

If the rotor is assumed rotating at a speed ω [rad/s], assuming a sinusoidal concatenated flux with amplitude $\lambda_0$ and frequency f [Hz], the concatenated flux $\lambda_A$ of the phase A of the motor can be expressed as follows:

$$\lambda_A = \lambda_0 \sin(p\omega t) = \lambda_0 \sin(2\pi f \cdot t) = \lambda_0 \sin(\vartheta)$$

depending on time t and number of polar torques p of the motor.

From the relationship between angular speed of the motor and its electric frequency, we have:

$$f = \frac{p\omega}{2\pi}$$

The phase voltage of the motor under no-load operating conditions (null current) is equal to the time derivative of the concatenated flux, according to the following formula:

$$V_A = \frac{d\lambda_A}{dt} = \omega\lambda_0\cos(p\omega t) = \omega\lambda_0\cos(\vartheta)$$

The same relationship is also valid for phases B and C of the motor, so that globally the triad of phase voltages of the motor has a sinusoidal shape, whose angle contains information about the rotor position.

The thereby computed position of the magnetic field of the rotor is then compared with the position of the magnetic field of the position sensor 51 detected at the same time instant.

In the sixth step, the value of the difference between the electric angle of the two magnetic fields is saved in the storage unit 54 and used as offset data to correctly drive the electric machine.

Advantageously, the process for calibrating electric machines of the invention allows, when producing the motor, performing an error measure between the position of the rotor detected by the position sensor associated thereto, and the instantaneous angular position of the magnetic poles of the rotor, in order to perform an optimum driving of the electric machine using the actual value of the angular position of the rotor.

The invention claimed is:

1. A measuring circuit (100) of a voltage of an electric machine comprising a first operational amplifier (20) having its non-inverting input (6) connected to a non-inverting input (10) of at least one second operational amplifier (30), and its output (7) feedback connected, through a resistance (R5), to an inverting input (5), said inverting input (5) of the first operational amplifier (20) being further connected through a resistance (R6) to a first phase (C) of the input current to an electric machine, the output (7) of the first operational amplifier (20) being connected, through a resistance (R8), to the inverting input (2) of a third operational amplifier (40) which has its non-inverting input (3) connected to a reference voltage rotor (VREF), said output (7) of the first operational amplifier (20) being further connected to a first output (VC) of the circuit, which is at a voltage value equal to the voltage of a first phase of the electric machine to be measured, said third operational amplifier (40) having its output (1) feedback connected, through a capacitance (C1), to the inverting input (2), said output (1) of the third operational amplifier (40) being further connected through a resistance (R10) to the non-inverting input (6) of the first operational amplifier (20) and to the non-inverting input (10) of the second operational amplifier (30).

2. The measuring circuit (100) according to claim 1, characterized in that the second operational amplifier (30) comprises its output (8) feedback connected, through a resistance (R3), to the inverting input (9), said inverting input (9) being further connected through a resistance (R4) to a second phase (B) of the input current to the electric machine, the output (8) of the second operational amplifier (30) being connected, through a resistance (R7), to the inverting input (2) of the third operational amplifier (40) and being further connected to a second output (VB) of the circuit, which is at a voltage value equal to the voltage of a second phase of the electric machine to be measured.

3. The measuring circuit (100) according to claim 1, characterized in that it comprises a fourth operational amplifier (50) having its non-inverting input (12) connected to the non-inverting input (6, 10) of the first operational amplifier (20) and of the second operational amplifier (30), and its output (14) feedback connected, through a resistance (R1), to the inverting input (13), said inverting input (13) being further connected through a resistance (R2) to a third phase (A) of the input current to the electric machine, the output (14) of the fourth operational amplifier (50) being connected, through a resistance (R9), to the inverting input (2) of the third operational amplifier (40) and being further connected to a third output (VA) of the circuit, which is at a voltage value equal to the voltage of a third phase of the electric machine to be measured.

4. A system (200) for calibrating electric machines comprising:
- a position sensor (51) connectable to a rotor of the electric machine and configured to measure an angular position of the rotor;
- a storage unit (54) in which data are stored which are computed during a production of the electric machine and usable for correcting errors between the position of the rotor detected by the position sensor (51) and the actual angular position of the rotor;
- a microprocessor (55) connected to the position sensor (51) and to the storage unit (54) and configured for storing in the storage unit (54) the information detected by the position sensor (51), managing and processing the information stored in the storage unit (54) and/or detected by the position sensor (51) and communicating the processed data to an inverter (60) connected to the electric machine through analogue (21) and/or digital (22) communication lines, to drive the electric machine using an actual value of the angular position of the rotor; and
- the measuring circuit (100) of the voltage of an electric machine according to claim 1.

5. A process for calibrating electric machines with a system (200) according to claim 4, comprising the following steps:
- a first step wherein the inverter (60) connected to the electric machine is turned on, to rotate the rotor;
- a second step wherein the electric machine is driven till the rotor reaches a rotation speed ($\omega_1$) greater than a predefined rotation speed ($\omega_0$);
- a third step wherein the inverter (60) is turned off and the electric machine is left rotate with no load;
- a fourth step, performed when the rotor reaches the predefined rotation speed ($\omega_0$), wherein the angular position of the rotor is detected, by measuring the position of a magnetic field of the rotor, to compare it with the measure of the angular position of the rotor detected by the position sensor (51), performed by measuring the position of the magnetic field of the position sensor (51);
- a fifth step wherein a difference is computed between the value of the angular position of the rotor, detected by measuring the position of its magnetic field, and the value of the angular position of the rotor detected by measuring the position of the magnetic field of the position sensor (51), to obtain an offset data to be stored;
- a sixth step wherein the offset data computed in the fifth step are stored in the storage unit (54).

6. The process for calibrating electric machines according to claim 5, characterized in that the measure of the difference between the angular position of the magnetic field of the rotor, and the angular position of the rotor detected by the position sensor (51), performed in the fifth step, is performed by measuring the value of an angle of the magnetic field of the rotor through the measure of the phase voltages of the machine, which are in phase with the magnetic flux, using the voltage measuring circuit (100) according to claim 1.

* * * * *